(12) United States Patent
Citta et al.

(10) Patent No.: US 8,144,750 B2
(45) Date of Patent: Mar. 27, 2012

(54) CODE ENHANCED EQUALIZATION BASED UPON A RELIABILITY FACTOR

(75) Inventors: Richard W. Citta, Oak Park, IL (US); Peter Ho, Chicago, IL (US)

(73) Assignee: Zenith Electronics LLC, Lincolnshire, IL (US)

( * ) Notice: Subject to any disclaimer, the term of this patent is extended or adjusted under 35 U.S.C. 154(b) by 2278 days.

(21) Appl. No.: 10/815,335

(22) Filed: Apr. 1, 2004

(65) Prior Publication Data

US 2004/0190662 A1   Sep. 30, 2004

Related U.S. Application Data

(62) Division of application No. 09/572,122, filed on May 17, 2000, now Pat. No. 6,947,481.

(51) Int. Cl.
*H04B 1/00* (2006.01)

(52) U.S. Cl. ........ 375/149; 375/130; 375/136; 375/147; 375/316; 375/341; 370/342; 714/752; 714/755; 714/780

(58) Field of Classification Search .......... 375/140–149, 375/341–347, 267, 295, 299, 150, 152, 226, 375/259, 260, 306, 355, 359, 135, 137, 316, 375/327, 262, 265; 714/755–780
See application file for complete search history.

(56) References Cited

U.S. PATENT DOCUMENTS

| 3,582,879 | A | | 6/1971 | Sullivan |
| 5,708,665 | A | | 1/1998 | Luthi |
| 5,920,599 | A | * | 7/1999 | Igarashi .................. 375/341 |
| 5,926,488 | A | | 7/1999 | Khayrallah |
| 6,088,389 | A | | 7/2000 | Larsson |
| 6,215,818 | B1 | | 4/2001 | Velez |
| 6,278,730 | B1 | * | 8/2001 | Tsui et al. ................ 375/224 |
| 6,320,919 | B1 | * | 11/2001 | Khayrallah et al. ......... 375/347 |
| 6,353,911 | B1 | * | 3/2002 | Brink ............................ 714/780 |
| 6,381,726 | B1 | * | 4/2002 | Weng ............................ 714/780 |
| 6,393,075 | B1 | * | 5/2002 | Xu ................................. 375/341 |
| 6,418,164 | B1 | | 7/2002 | Endres et al. |
| 6,430,208 | B1 | * | 8/2002 | Fullerton et al. .............. 375/130 |
| 6,498,816 | B1 | * | 12/2002 | Easwar et al. ........... 375/240.26 |
| 6,522,696 | B1 | * | 2/2003 | Mobin et al. .................. 375/262 |
| 6,567,481 | B1 | * | 5/2003 | Molnar ......................... 375/341 |
| 6,584,151 | B1 | | 6/2003 | Dehghan |

(Continued)

FOREIGN PATENT DOCUMENTS

WO    WO 99/50983    10/1999

OTHER PUBLICATIONS

Kohno et al., "Automatic Equalizer Including a Decoder of Error-Correcting Code and its Development", Electronics and Communications in Japan, Part 1, vol. 68, No. 11, 1985, pp. 66-77.

Mignone et al., "CD3-OFDM: A New Channel Estimation Method to Improve the Spectrum Efficiency in Digital Terrestrial Television Systems", International Broadcasting Convention, Sep. 14-18, 1995, pp. 122-128.

(Continued)

*Primary Examiner* — Hirdepal Singh

(57) ABSTRACT

A receiver includes an equalizer and a decoder which decodes data from a signal. The signal is based upon an output of the equalizer. The receiver also includes an encoder, which re-encodes the decoded data, and an error generator, which generates an error vector based upon the signal and the encoded data and which weights the error vector according to a reliability that the decoder accurately decoded the data from the signal. A controller controls the equalizer in response to the weighted error vector.

23 Claims, 2 Drawing Sheets

U.S. PATENT DOCUMENTS

| | | | | |
|---|---|---|---|---|
| 6,591,390 B1* | 7/2003 | Yagyu | ............................ | 714/755 |
| 6,690,714 B1* | 2/2004 | Iwamatsu et al. | .............. | 375/148 |
| 6,690,723 B1* | 2/2004 | Gosse et al. | .................. | 375/233 |
| 6,782,046 B1 | 8/2004 | Ling | | |
| 6,799,294 B1* | 9/2004 | Chung | ........................ | 714/786 |
| 6,804,307 B1* | 10/2004 | Popovic | ........................ | 375/299 |
| 7,254,649 B2* | 8/2007 | Subramanian et al. | ........... | 710/8 |
| 2001/0036223 A1* | 11/2001 | Webster et al. | ............... | 375/152 |
| 2003/0099316 A1 | 5/2003 | Citta et al. | | |
| 2005/0046600 A1* | 3/2005 | Bretl et al. | ...................... | 341/50 |
| 2006/0193373 A1* | 8/2006 | Agee et al. | .................... | 375/141 |
| 2007/0177697 A1* | 8/2007 | Calderbank et al. | .......... | 375/347 |

OTHER PUBLICATIONS

Masoomzadeh-Fard et al., "Nonlinear Equalization of Multipath Fading Channels with Noncoherent Demodulation", IEEE Journal on Selected Areas in Communications, vol. 14, No. 3, Apr. 1996, pp. 512-520.

Fazel, "Iterative Decoding of Generalized Concatenated Blokh-Zyablov-Codes", Publication Date: Jun. 23, 1996, pp. 96-101.

Nagayasu et al., "Receiver with iterative soft decision for frequency selective fading channels", Electronics Letters Apr. 30, 1998, vol. 34, No. 9.

* cited by examiner

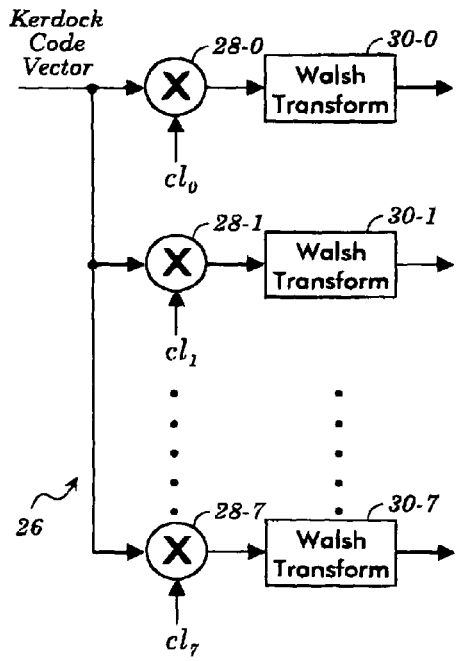
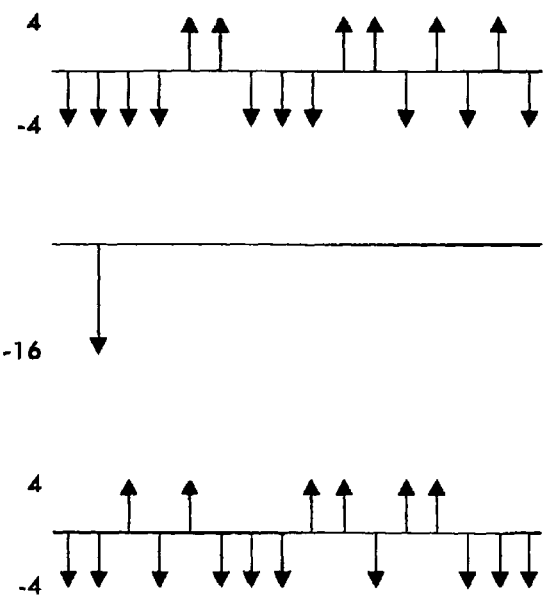
Figure 4
Figure 5
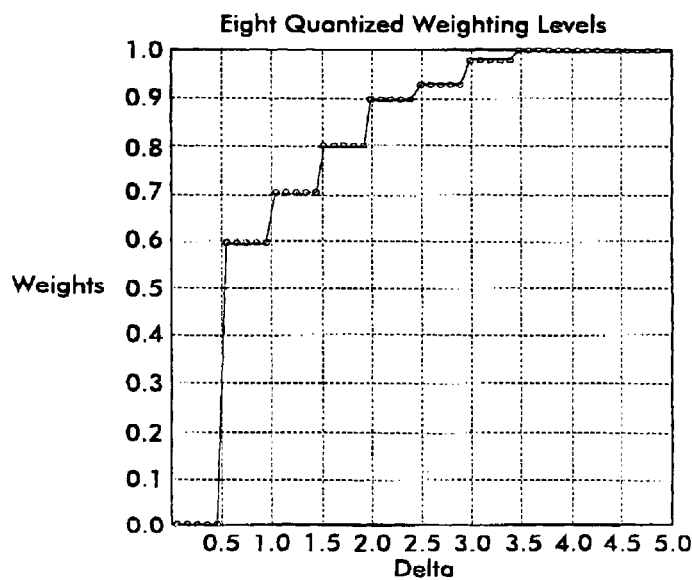
Figure 6

US 8,144,750 B2

CODE ENHANCED EQUALIZATION BASED UPON A RELIABILITY FACTOR

RELATED APPLICATIONS

This application is a divisional of U.S. application Ser. No. 09/572,122 filed May 17, 2000 now U.S. Pat. No. 6,947,481.

RELATED APPLICATIONS

This application contains disclosure similar to the disclosure in U.S. application Ser. No. 09/052,501 filed Mar. 31, 1998.

TECHNICAL FIELD OF THE INVENTION

The present invention relates to an arrangement for decoding transmitted data and for using the decoded data to enhance the operation of an equalizer.

BACKGROUND OF THE INVENTION

An equalizer is typically used in receivers to reduce noise and communication channel effects which would otherwise make the accurate recovery of transmitted data difficult. Equalizers are frequently implemented as time domain filters which multiply received signals by a plurality of taps and which sum the multiplication results to produce corresponding equalizer outputs. The values of an equalizer's taps are adjusted during operation of the equalizer to optimize the equalizer's performance. Feed forward or feedback control may be used for the tap value adjustment.

In a feed forward approach, a channel estimator may be used to estimate the channel, and the values of the equalizer's taps are modified based upon the estimated channel. In a feedback approach, an output of the equalizer is compared either with a training signal or with decoded data, although both may be used. If both a training signal and decoded data are used, the training signal may be used at start up because the initial values of the equalizer's taps may not otherwise permit the equalizer to converge on its optimized tap values. Once convergence is achieved, decoded data may be used to maintain convergence. That is, assuming that the equalizer is operating optimally, decoded data downstream of the equalizer should be the transmitted data and can be used as feedback in order to control the values of the equalizer's taps.

During periods of time varying noise conditions within the communication channel, however, the equalizer can lose its convergence. During such periods, stabilization of the equalizer's behavior can be attempted by permitting the equalizer to coast until the noise condition has dissipated. As the equalizer coasts, however, the equalizer can drift away from its optimized tap values.

The present invention is directed to an arrangement which effectively controls the tap values of an equalizer even during periods of time varying noise conditions.

SUMMARY OF THE INVENTION

In accordance with one aspect of the present invention, a receiver comprises an equalizer, a decoder, an encoder, an error generator, and a controller. The decoder decodes data from a signal, and the signal is based upon an output of the equalizer. The encoder re-encodes the decoded data. The error generator generates an error based upon the signal and the re-encoded data and weights the error according to a reliability that the decoder accurately decoded the data from the signal. The controller controls the equalizer in response to the weighted error.

In accordance with another aspect of the present invention, an electrical signal represents a plurality of first data elements. A first portion of the first data elements designates a sign, a second portion of the first data elements designates a plurality of second data elements, and a third portion of the first data elements designates a plurality of third data elements. The electrical signal includes a plurality of fourth data elements derived from the sign and the second and third data elements.

In accordance with still another aspect of the present invention, a method comprises decoding data from a data signal, wherein the data signal is based upon an output of an equalizer; re-encoding the decoded data; providing a feedback signal based upon the data signal, the re-encoded data, and a reliability that the decoding of the data from the data signal is performed accurately; and, controlling the equalizer in response to the feedback signal.

BRIEF DESCRIPTION OF THE DRAWINGS

These and other features and advantages of the present invention will become more apparent from a detailed consideration of the invention when taken in conjunction with the drawings in which:

FIG. 4 shows the Kerdock decoder of FIG. 3 in additional detail;

FIG. 5 illustrates an exemplary set of transformed vectors provided as an output of the Walsh Transforms of FIG. 4; and, FIG. 6 illustrates an exemplary set of reliability weighting levels r which can be provided by the Kerdock decoder of FIG. 3.

DETAILED DESCRIPTION

Figure 1:
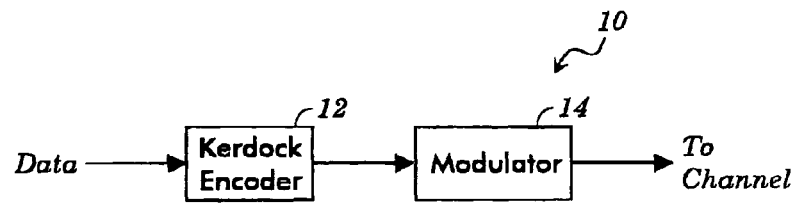
FIG. 1 is a block diagram of a transmitter which may be used in conjunction with the present invention.

A hard slicer is typically used to threshold the output of an equalizer. The hard slicer applies fixed decision boundaries to the output of the equalizer in order to map the equalizer's output to corresponding data. Gain may be provided by replacing the hard slicer with a code that provides a soft gain. An example of an inner code which can be used for this purpose is the Kerdock code.

Kerdock code vectors have a length typically defined as the number of bits per code vector. For purposes of describing the present invention, it is assumed that a code vector has a length of sixteen indicating that there are sixteen bits in each code vector. However, it should be understood that code vectors having different lengths may be used with respect to the present invention. For example, code vectors having a length of 64, 256, or more may be used with respect to the present invention.

It is known that there are 256 code vectors when the code vectors have a length of sixteen. If one of these 256 code vectors is properly chosen as a reference code vector, then there are 112 code vectors which have a distance of six from the reference code vector, there are 30 code vectors which have a distance of eight from the reference code vector, there are 112 code vectors which have a distance of ten from the reference code vector, and there is one code vector which has a distance of sixteen from the reference code vector. The code vector which has a distance of sixteen from the reference code vector is the complement of the reference code vector. Distance is defined here as the number of bits which can be changed in one code vector before that code vector equals another code vector.

This reference code vector, the 30 code vectors which have a distance of eight from this reference code vector, and the complement (i.e., negative) of this reference code vector may be selected as a coset, and the reference code vector may be designated as the coset leader of the coset. Each code vector of these 32 code vectors has a complement in the coset. Accordingly, a coset contains first and second groups of code vectors, where each group contains sixteen code vectors, and where each code vector in the first group has a complement in the second group. Therefore, it is useful to envision a coset as containing sixteen code vectors, where each code vector can be either positive or negative.

The 256 code vectors may be similarly divided into seven more cosets, each having a coset leader, so that there are a total of eight cosets. The code vectors in each of these cosets are referred to as Kerdock code vectors.

A code vector may be transmitted by a transmitter 10 shown in FIG. 1 so that it represents a number of data elements. A data element may be a bit or bits, a symbol or symbols, or another unit or units of information. The transmitter includes a Kerdock encoder 12, which encodes each byte (i.e., eight data elements) of data as a Kerdock code vector, and a modulator 14, which modulates the Kerdock code vector onto a carrier. A byte of data, for example, contains data elements b7 b6 b5 b4 b3 b2 b1 b0.

In encoding a data byte as a Kerdock code vector, the byte is partitioned such that one data element selects a sign (+ or −), three data elements select a coset leader, and four data elements select a Walsh function. For example, the data element b7 may be used to select the sign (+ or −), the data elements b6-b4 may be used to select the coset leader, and the data elements b3-b0 may be used to select the Walsh function. Because data elements b6-b4 comprise three data elements, they may be used to select one of eight coset leaders. Because data elements b3-b0 comprise four data elements, they may be used to select one of sixteen Walsh functions. The selected Walsh function is then mapped to one of the sixteen rows of the binary Walsh-Hadamard matrix. The binary Walsh-Hadamard matrix is a 16×16 matrix of ones and minus ones. Thus, data elements b3-b0 having a value 0000 correspond to a Walsh function equaling 0, and this Walsh function is mapped to the first row of the binary Walsh-Hadamard matrix. Similarly, data elements b3-b0 having a value 0001 correspond to a Walsh function equaling 1 which is mapped to the second row of the binary Walsh-Hadamard matrix, and so on. The selected coset leader and the selected matrix row are then vector multiplied. That is, each data element of the selected coset leader and its corresponding data element in the selected matrix row are multiplied. The sign of the multiplication result is changed if the data element b7 equates to a minus sign, and is not changed if the bit b7 equates to a plus sign.

As an example, let it be assumed that a data byte 10010001 is to be encoded as a Kerdock code vector. The coset leader of coset 1 (cl1) is selected because the data elements b6-b4 have a value of 001. The coset leader cl1, for example, may have the following bit pattern:

cl1=1 1 −1 1 1 −1 1 −1 1 −1 −1 1 1 1 1 1

The values of data elements b3-b0 can range from 0000 to 1111 corresponding to Walsh functions w0, w1, . . . , w15. The data elements b3-b0 in the data byte 10010001 have a value 0001 and, therefore, represent Walsh function w1 which corresponds to the second row of the binary Walsh-Hadamard matrix. The following second row is selected as the Walsh function w1:

w1=1 −1 1 −1 1 −1 1 −1 1 −1 1 −1 1 −1 1 −1

The coset leader cl1 and the Walsh function w1 are vector multiplied as (cl1)(w1) producing the following result:

(cl1)(w1)=1 −1 −1 1 1 1 1 1 1 1 −1 −1 1 −1 1 −1

Finally, because the data element b7 is a one which represents a minus sign, the result of (cl1)(w1) is multiplied by −1 to produce the following Kerdock code vector:

(−1)(cl1)(w1)=−1 1 1 −1 −1 −1 −1 −1 −1 −1 1 1 1 −1 1 −1 1

Figure 2:
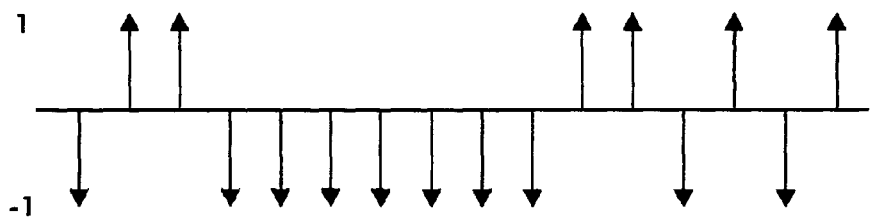
FIG. 2 is an exemplary Kerdock code vector that may be transmitted by the transmitter of FIG. 1.
Figure 3:
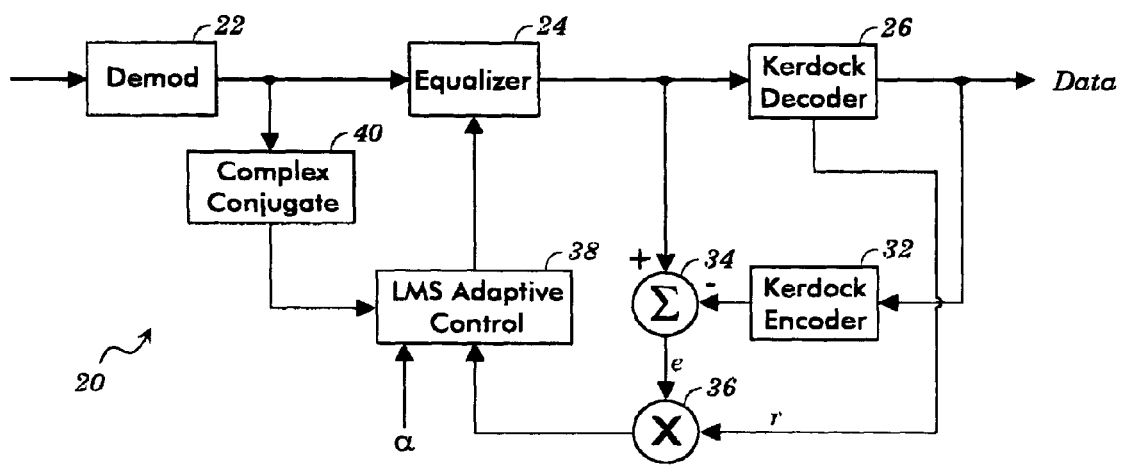
FIG. 3 is a block diagram of a receiver which may be used in conjunction with the present invention.

This vector is shown graphically in FIG. 2. Instead of performing the above calculations for each byte of data to be transmitted, the Kerdock encoder 12 can store in memory each of the possible Kerdock code vectors in a look-up table at an address corresponding to its associated data byte value so that the memory stores 256 Kerdock code vectors in all.

A receiver 20 receives each Kerdock code vector from the channel. The receiver 20 includes a demodulator 22 which demodulates the received signal to recover the transmitted Kerdock vector. The Kerdock code vectors at the output of the demodulator 22 are equalized in an equalizer 24 and are then applied to a Kerdock decoder 26 which decodes the received Kerdock code vectors in order to recover the transmitted data. The equalizer 24 may be implemented as a time domain filter which multiplies the received signal by a plurality of taps and which sums the multiplication results to produce an equalizer output.

The Kerdock decoder 26, which is shown more fully in FIG. 4, includes eight multipliers 28-0, 28-1, . . . , 28-7 each of which multiplies the received Kerdock code vector by a corresponding one of the eight coset leaders cl0, cl1, . . . , cl7. These multiplications produce eight vectors each having a length of sixteen. Each of eight Walsh transforms 30-0, 30-1, . . . , 30-7 is performed on a corresponding one of these eight vectors. The largest correlation peak within the transform peak spectra produced by the Walsh transforms 30-0, 30-1, . . . , 30-7 determines the coset leader which was used to generate the transmitted Kerdock code vector, the position of this peak within the transform peak spectra determines the Walsh function which was used to generate the transmitted Kerdock code vector, and the sign of the peak determines the data element b7.

For example, if it is assumed that the transmitted Kerdock code vector was generated using coset leader cl1, Walsh function w1, and sign of minus as described above, FIG. 5 shows exemplary outputs of the Walsh Transforms 30-0, 30-1, . . . , 30-7. Because the largest peak (−16) corresponds to coset leader cl1 which in turn corresponds to data elements b6-b4 having a value 001, because the largest peak is the second peak within the transform peak spectra and, therefore, corresponds to data elements b3-b0 having a value 0001, and because the largest peak has a minus sign which corresponds to the data element b7 having a value of 1, the Kerdock decoder 26 decodes the received Kerdock code vector as the byte 10010001.

The exemplary spectra produced by the Walsh Transforms 30-0, 30-1, . . . , 30-7 shown in FIG. 5 assumes no noise and channel effects. In general, however, there are noise and other effects in the channel all of which will likely alter the spectral outputs of the Walsh Transforms 30-0, 30-1, . . . , 30-7 so that the difference in magnitude between the largest peak and the next largest peak will not be as large as shown in FIG. 5. Indeed, the largest peak may not even correspond to the Kerdock code vector actually transmitted. Because of these possibilities, the equalizer 24 is controlled in such a way as to increase the likelihood that the largest peak will correspond to the Kerdock code vector actually transmitted.

Accordingly, a Kerdock encoder 32, which may be identical to the Kerdock encoder 12 of the transmitter 10, re-encodes the data from the output of the Kerdock decoder 26. The output of Kerdock encoder 32 is subtracted from the input to the Kerdock decoder 26 by a summer 34 to form an error vector e representing the difference between the transmitted Kerdock code vector as received and a Kerdock code vector based upon the output from the Kerdock decoder 26. The error vector e and a reliability weighting level r are multiplied together by a multiplier 36. Code gain is provided by the Kerdock decoder 26.

The reliability weighting level r is used by the multiplier 36 to scale the feedback represented by the error vector e and is a quantized value depending upon $\Delta$, which is the difference between the absolute value of the Walsh Transform output peak having the largest magnitude and the absolute value of the Walsh Transform output peak having the next largest magnitude.

It is this $\Delta$ that determines the reliability of the feedback error vector e. Thus, a larger value of $\Delta$ implies that the decoding implemented by the Kerdock decoder 26 is more reliable. Accordingly, if the value of $\Delta$ is large, the reliability weighting factor r is set to one or nearly one so that most or all of the feedback error vector e is used to adjust the equalizer 24 as discussed below. On the other hand, a value of $\Delta$ which is small implies that the decoding implemented by the Kerdock decoder 26 is less reliable because of noise such as burst noise in the channel. Noise in the channel can change the magnitude of the dominant peak and also change its position within the transform peak spectra provided by the Walsh Transforms 30-0 to 30-7. Thus, if the value of $\Delta$ is small, the reliability weighting factor r is set to less than one so that less of the feedback error vector e is used to adjust the equalizer 24. In this event, the taps of the equalizer 24 will not be significantly changed.

FIG. 6 shows in graph form an exemplary relationship between the difference $\Delta$ (shown along the x axis) and the reliability weighting factor r (shown along the y axis). This relationship is stored in memory, permitting the Kerdock decoder 26 to read out the reliability weighting factor r based upon the difference $\Delta$ that it computes from the transform peak spectra provided by the Walsh Transforms 30-0 to 30-7. The Kerdock decoder 26 supplies this reliability weighting factor r to the multiplier 36.

The adjusted error vector re is supplied to an LMS (Least Mean Squares) adaptive control 38. Also supplied to the LMS adaptive control 38 is a complex conjugated version of the output of the demodulator 22 derived by a complex conjugator 40. The LMS adaptive control 38 essentially multiplies the complex conjugated version of the output of the demodulator 22 by the adjusted error vector re. The result of this operation may be multiplied by $\alpha$ which is less than one and which assures that changes to the tap values of the equalizer 24 are made in incremental steps. The output of the LMS adaptive control 38 is added to the tap values used by the equalizer 24 in order to permit the Kerdock decoder 26 to accurately decode received Kerdock code vectors.

Accordingly, in the presence of substantial time varying noise, little or no change is made to the tap values of the equalizer 24 allowing the equalizer 24 to rely upon previously good channel estimates until the noise abates.

Certain modifications of the present invention have been discussed above. Other modifications will occur to those practicing in the art of the present invention. For example, as described above, the reliability weighting level r is a quantized value depending upon the difference between the absolute value of the Walsh Transform output spectral peak having the largest magnitude and the absolute value of the Walsh Transform output spectral peak having the next largest magnitude. Alternatively, the reliability weighting level r may be determined solely from the Walsh Transform output spectral peak having the largest magnitude. In this case, the Walsh Transform output spectral peak having the largest magnitude might be used, for example, only if such peak has a magnitude greater than a threshold. As a still further alternative, the reliability weighting level r may be based upon the difference between the square of the absolute value of the Walsh Transform output spectral peak having the largest magnitude and the square of the absolute value of the Walsh Transform output spectral peak having the next largest magnitude.

Also, according to the description above, a Walsh transform is used to determine a transmitted code vector. However, other transforms may be used to determine the transmitted code vectors.

Moreover, as disclosed above, data is encoded using Kerdock code vectors. Other types of code vectors, however, may be used instead of Kerdock code vectors. Multiple coding techniques also may be implemented to encode the data.

If transforms other than Walsh transforms are used to determine a transmitted code vector, and if code vectors other than Kerdock code vectors are used to transmit data, then reliability factors may be determined by methods other than those described above in order to weight the feedback error vector e.

In addition, the transmitter 10 and the receiver 20 are shown as comprising various blocks. Each of these blocks may be implemented as one or more discrete components, one or more integrated circuits, one or more programmable logic circuits or arrays, software, and/or the like. In addition, the transmitter 10 and the receiver 20 may include other blocks as necessary to encode and decode data.

Furthermore, as disclosed above, the tap values of the equalizer 24 are adjusted by the LMS adaptive control 38. However, other controllers can be used in place of the LMS adaptive control 38. For example, a zero forcing algorithm, a recursive least mean squares algorithm, a Kalman filter, and/or the like may be used to adjust the tap values of the equalizer 24.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:
1. A method comprising:
  receiving a signal containing a code vector;
  decoding the code vector, wherein the decoding includes
    deriving a set of received signal values corresponding to the code vector;
  generating a reliability factor based upon a difference between at least two of the received signal values, wherein the reliability factor is a measure of reliability of the decoding; and generating a feedback based on the reliability factor to adjust tap coefficients of an equalizer.

2. The method of claim 1 wherein one of the two received signal values is a largest of the received signal values.

3. The method of claim 1 wherein the two received signal values comprise a largest and a next largest of the received signal values.

4. The method of claim 3 further comprising controlling an equalizer in accordance with the reliability factor.

5. The method of claim 1 wherein the received signal values are correlation peaks.

6. The method of claim 1 wherein the generating of a reliability factor based upon a difference between at least two of the received signal values comprises generating a reliability factor based upon a difference between the squares of the two received signal values.

7. The method of claim 1 wherein the generating of a reliability factor based upon a difference between at least two of the received signal values comprises generating a reliability factor based upon a difference between a square of a largest and a square of a next largest of the received signal values.

8. A method comprising:
receiving a signal containing a code vector;
decoding the code vector, wherein the decoding includes deriving a set of received signal values corresponding to the code vector; and,
generating a reliability factor based upon at least one of the received signal values, wherein the reliability factor is a measure of reliability of the decoding, and wherein the generating of a reliability factor based upon at least one of the received signal values comprises generating a reliability factor based upon a comparison of the one received signal value to a threshold.

9. The method of claim 8 wherein the one received signal value is a largest one of the received signal values.

10. The method of claim 8 wherein the generating a reliability factor based upon a comparison of the one received signal value to a threshold comprises generating the reliability factor only if the one received signal value is greater than the threshold.

11. The method of claim 8 wherein the reliability factor that is generated is dependent upon the magnitude of the one received signal value.

12. A method comprising:
receiving a signal containing a code vector;
decoding the received code vector, wherein the decoding includes correlating the received code vector with a plurality of reference code vectors so as to produce a plurality of values corresponding to each of the reference code vectors, and wherein the values correspond to an amount of correlation between the received code vector and the reference code vectors;
generating a reliability factor based upon at least one of the values, wherein the reliability factor is a measure of the reliability of the decoding; and
generating a feedback based on the reliability factor to adjust tap coefficients of an equalizer.

13. The method of claim 12 wherein the generating of a reliability factor comprises generating a reliability factor based on a largest of the values.

14. The method of claim 12 wherein the generating of a reliability factor comprises generating a reliability factor based on a difference between two of the values.

15. The method of claim 12 wherein the generating of a reliability factor comprises generating a reliability factor based on a difference between a largest and a next largest of the values.

16. The method of claim 12 wherein the generating of a reliability factor comprises generating a reliability factor based on a comparison of one of the values to a threshold.

17. The method of claim 12 wherein the generating of a reliability factor comprises generating a reliability factor based upon a difference between the squares of two of the values.

18. A method comprising:
receiving a signal containing a code vector;
deriving a plurality of sets of values corresponding to the code vector, wherein one of the sets contains a value that is largest;
decoding the code vector according to the set of values containing the largest value;
generating a reliability factor based upon at least one of the values, wherein the reliability factor is a measure of the reliability of the decoding; and
generating a feedback based on the reliability factor to adjust tap coefficients of an equalizer.

19. The method of claim 18 wherein the generating of a reliability factor comprises generating a reliability factor based on the largest value.

20. The method of claim 18 wherein the generating of a reliability factor comprises generating a reliability factor based on a difference between two of the values.

21. The method of claim 18 wherein the generating of a reliability factor comprises generating a reliability factor based on a difference between a the largest value and a next largest value.

22. The method of claim 18 wherein the generating of a reliability factor comprises generating a reliability factor based on a comparison of one of the values to a threshold.

23. The method of claim 18 wherein the generating of a reliability factor comprises generating a reliability factor based upon a difference between the squares of two of the values.

* * * * *